US012237598B2

(12) United States Patent
Matsumura et al.

(10) Patent No.: US 12,237,598 B2
(45) Date of Patent: Feb. 25, 2025

(54) IN-VEHICLE WIRING MODULE

(71) Applicants: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

(72) Inventors: Nobuyuki Matsumura, Osaka (JP); Shinichi Takase, Osaka (JP)

(73) Assignees: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

( * ) Notice: Subject to any disclaimer, the term of this patent is extended or adjusted under 35 U.S.C. 154(b) by 69 days.

(21) Appl. No.: 18/020,159

(22) PCT Filed: Jul. 26, 2021

(86) PCT No.: PCT/JP2021/027492
§ 371 (c)(1),
(2) Date: Feb. 7, 2023

(87) PCT Pub. No.: WO2022/044645
PCT Pub. Date: Mar. 3, 2022

(65) Prior Publication Data
US 2023/0291136 A1    Sep. 14, 2023

(30) Foreign Application Priority Data
Aug. 27, 2020   (JP) ................................. 2020-143402

(51) Int. Cl.
*H01R 12/62*   (2011.01)

(52) U.S. Cl.
CPC .................................. *H01R 12/62* (2013.01)

(58) Field of Classification Search
CPC . B60R 16/04; H01M 2200/20; H01M 50/502; H01R 12/62; H05K 1/147;
(Continued)

(56) References Cited

U.S. PATENT DOCUMENTS

2008/0251280 A1   10/2008  Shi et al.
2014/0073196 A1*   3/2014  Hashim ............. H01R 13/6461
                                                                 439/676
(Continued)

FOREIGN PATENT DOCUMENTS

JP        2007-227856        9/2007
JP        2008-071812        3/2008
(Continued)

OTHER PUBLICATIONS

International Search Report issued in International Bureau of WIPO Patent Application No. PCT/JP2021/027492, dated Oct. 12, 2021, along with an English translation thereof.

*Primary Examiner* — Timothy J Thompson
*Assistant Examiner* — Guillermo J Egoavil
(74) *Attorney, Agent, or Firm* — Greenblum & Bernstein, P.L.C.

(57) ABSTRACT

An in-vehicle wiring module is configured to be attached to a plurality of electricity storage elements having electrode terminals. The in-vehicle wiring module includes busbars to be connected to the electrode terminals, flexible substrates having a first conductive path that is electrically connected to the busbars, and a rigid substrate having a second conductive path that is electrically connected to the first conductive paths. The flexible substrates overlap the rigid substrate. The flexible substrates each have a first opposing surface that is opposed to the rigid substrate. The first
(Continued)

conductive paths each have first lands that are arranged on the first opposing surface. First slits that are open at edges of the flexible substrates are formed between the first lands of the flexible substrates. The rigid substrate has a second opposing surface that is opposed to the flexible substrates.

6 Claims, 9 Drawing Sheets

(58) Field of Classification Search
CPC .......... H05K 2201/10272; H05K 2201/10977; H05K 3/363; Y02E 60/10
USPC ....................................................... 174/254
See application file for complete search history.

(56) References Cited

U.S. PATENT DOCUMENTS

| 2018/0130989 | A1 | 5/2018 | Saito et al. | |
|---|---|---|---|---|
| 2018/0219204 | A1* | 8/2018 | Takase | H01M 10/48 |

FOREIGN PATENT DOCUMENTS

| JP | 2015179644 A | * | 10/2015 | ............. Y02E 60/10 |
|---|---|---|---|---|
| WO | 2016/175180 | | 11/2016 | |

* cited by examiner

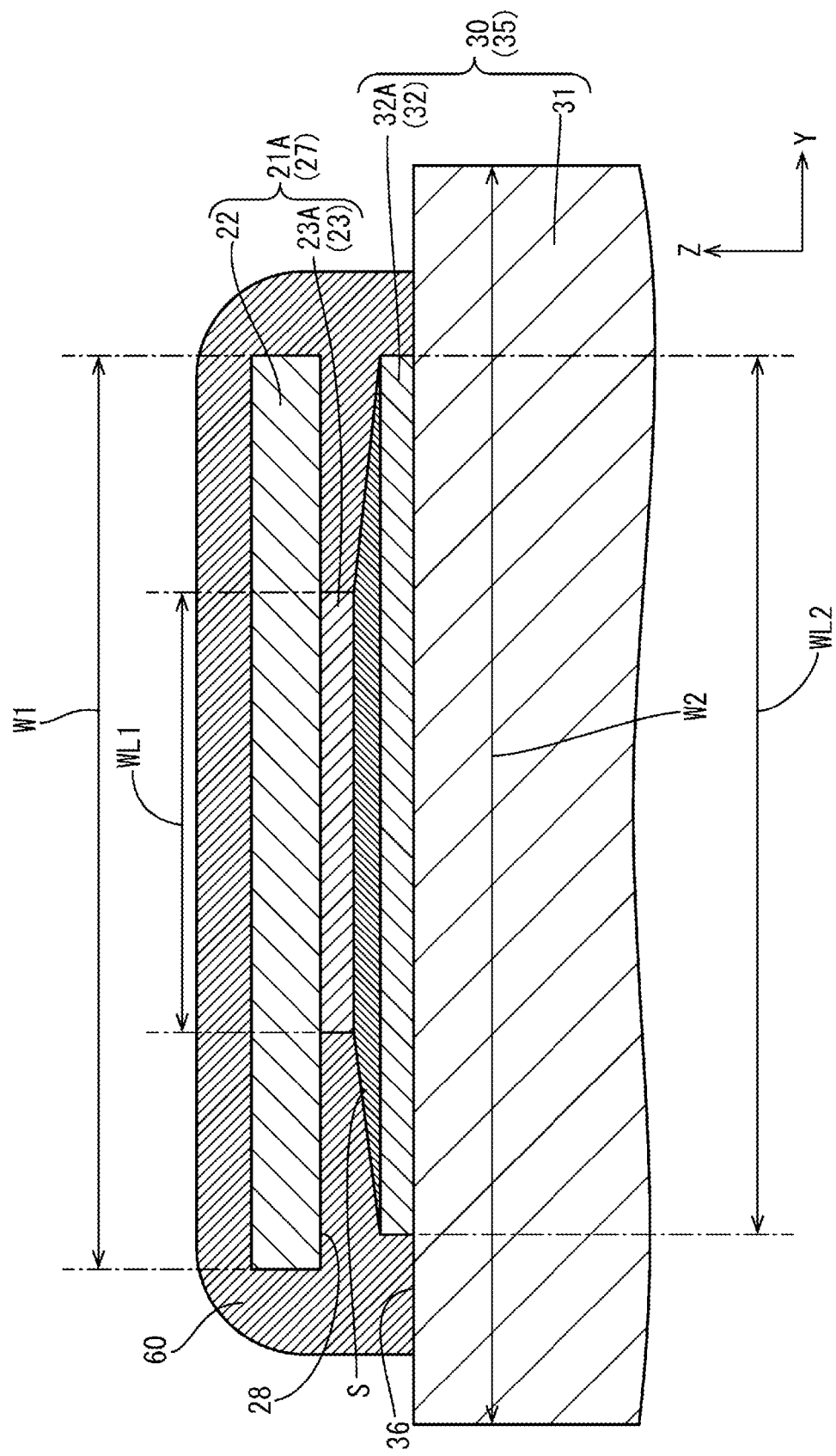

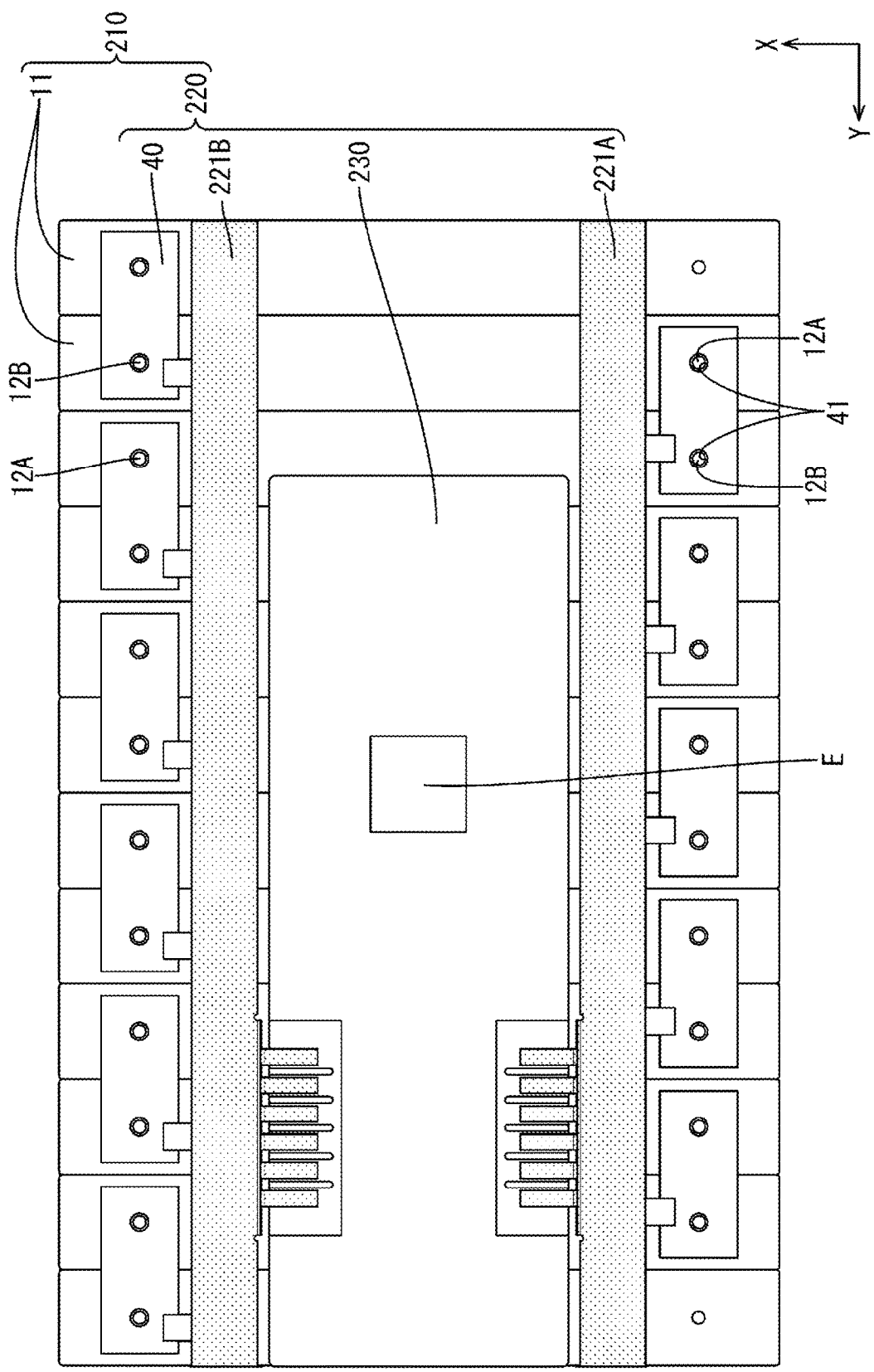

IN-VEHICLE WIRING MODULE

TECHNICAL FIELD

The present disclosure relates to an in-vehicle wiring module.

BACKGROUND ART

The inter-substrate connection structure disclosed in JP 2008-71812A (Patent Document 1 below) has been conventionally known as an inter-substrate connection structure for a flexible substrate and a rigid substrate. The inter-substrate connection structure disclosed in Patent Document 1 includes a flexible substrate having first conductors, a rigid substrate having second conductors, and an insulating layer provided between the first conductors and between the second conductors. The first conductors and the second conductors, which are opposed to each other, are electrically connected by melting solder plating disposed on the first conductors or the second conductors, or both. Filling the space between the flexible substrate and the rigid substrate with the insulating layer prevents short circuits from occurring between the first conductors and between the second conductors.

CITATION LIST

Patent Document

Patent Document 1: JP 2008-71812A

SUMMARY OF INVENTION

Technical Problem

In the case where the above-mentioned configuration is applied to a wiring module for an electricity storage pack to be mounted in a vehicle, since a high voltage is applied to the first conductors and the second conductors, there is concern that short circuits will occur between the first conductors and between the second conductors if insulation distances are not secured between the first conductors and between the second conductors. In the case of a wiring module inside a vehicle, there is also concern that water will attach to the wiring module due to dew condensation or the like. In this case, depending on how the insulating layer is disposed on the flexible substrate and the rigid substrate, water may enter between these substrates, thus making it likely that short circuits will occur between the first conductors and between the second conductors.

Solution to Problem

An in-vehicle wiring module of the present disclosure is an in-vehicle wiring module configured to be attached to a plurality of electricity storage elements having electrode terminals, the in-vehicle wiring module including: busbars to be connected to the electrode terminals; a flexible substrate having a first conductive path that is electrically connected to the busbars; and a rigid substrate having a second conductive path that is electrically connected to the first conductive path, wherein the flexible substrate overlaps the rigid substrate, the flexible substrate has a first opposing surface that is opposed to the rigid substrate, the first conductive path has first lands that are arranged on the first opposing surface, first slits that are open at an edge of the flexible substrate are formed between the first lands of the flexible substrate, the rigid substrate has a second opposing surface that is opposed to the flexible substrate, the second conductive path has second lands that are arranged on the second opposing surface and are electrically connected to the first lands, and second slits that are open at an edge of the rigid substrate are formed between the second lands of the rigid substrate.

Advantageous Effects of Invention

With the present disclosure, it is possible to provide an in-vehicle wiring module capable of suppressing short circuits.

BRIEF DESCRIPTION OF DRAWINGS

FIG. 9 is a cross-sectional view taken along line B-B in FIG. 8.

FIG. 10 is a plan view of an electricity storage module according to Embodiment 3.

DESCRIPTION OF EMBODIMENTS

Figure 1:
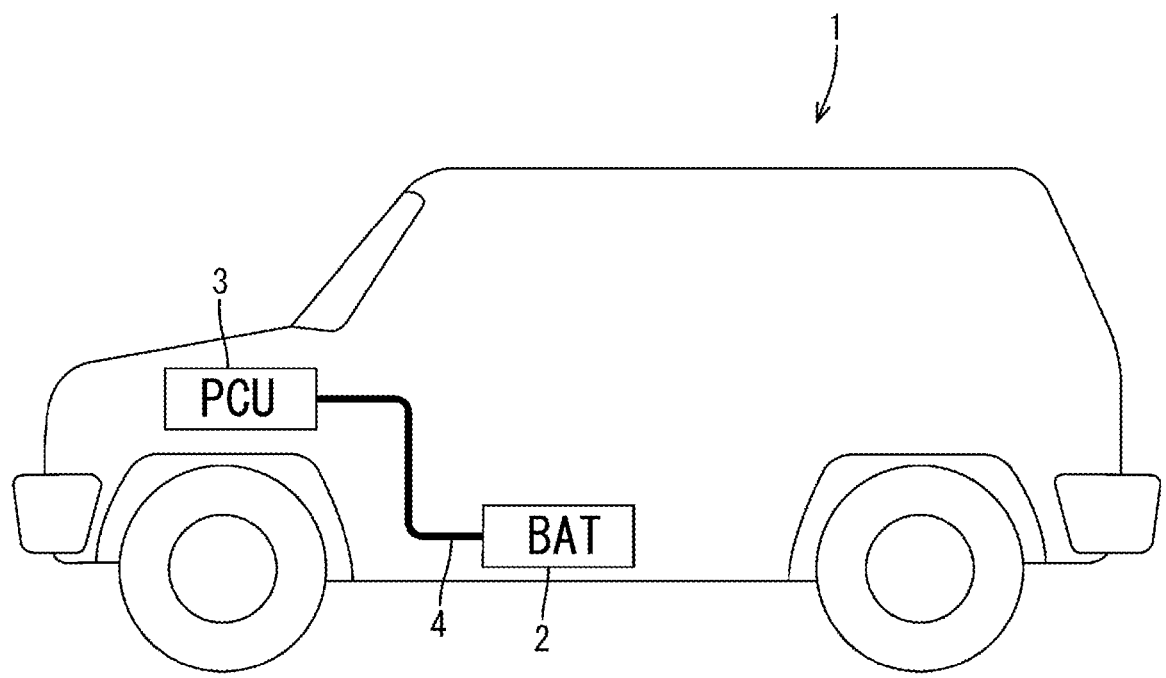
FIG. 1 is a schematic view showing a vehicle in which an electricity storage module according to Embodiment 1 is mounted.

Description of Embodiments of the Present Disclosure

First, aspects of the present disclosure will be listed and described.

(1) An in-vehicle wiring module of the present disclosure is an in-vehicle wiring module configured to be attached to a plurality of electricity storage elements having electrode terminals, the in-vehicle wiring module including: busbars to be connected to the electrode terminals; a flexible substrate having a first conductive path that is electrically connected to the busbars; and a rigid substrate having a second conductive path that is electrically connected to the first conductive path, wherein the flexible substrate overlaps the rigid substrate, the flexible substrate has a first opposing surface that is opposed to the rigid substrate, the first conductive path has first lands that are arranged on the first opposing surface, first slits that are open at an edge of the flexible substrate are formed between the first lands of the flexible substrate, the rigid substrate has a second opposing surface that is opposed to the flexible substrate, the second conductive path has second lands that are arranged on the second opposing surface and are electrically connected to the first lands, and second slits that are open at an edge of the rigid substrate are formed between the second lands of the rigid substrate.

With this configuration, the first slits are formed between the first lands of the flexible substrate and the second slits are formed between the second lands of the rigid substrate, thus making it less likely that short circuits will occur between the first lands and between the second lands.

(2) Portions of the flexible substrate that are separated by the first slits serve as first connection pieces, one of the first lands is arranged on each of the first connection pieces, portions of the rigid substrate that are separated by the second slits serve as second connection pieces, one of the second lands is arranged on each of the second connection pieces, and a width of the first connection pieces is different from a width of the second connection pieces.

(3) It is preferable that the width of the second connection pieces is set to be larger than the width of the first connection pieces.

With these configurations, the first connection pieces are arranged so as not to protrude past the second connection pieces, thus making it less likely that the first connection pieces will deform under an external force or the like.

(4) It is preferable that a width of the second lands is set to be larger than a width of the first lands.

It is conceivable that the width of the first lands and the distance between the first lands vary due to errors because the flexible substrate is more likely to deform than the rigid substrate. However, with this configuration, the width of the second lands is set to be larger than the width of the first lands, and therefore, it is easy to electrically connect the first lands and the second lands even when the width of the first lands and the distance between the first lands vary due to errors.

(5) It is preferable that the first conductive path is routed on only one surface of the flexible substrate.

With this configuration, the manufacturing cost of the flexible substrate can be reduced, thus making it possible to reduce the manufacturing cost of the in-vehicle wiring module.

(6) It is preferable that a connection portion where the first land and the second land are connected to each other is sealed by a sealing portion constituted by an insulating resin.

With this configuration, it is possible to suppress the accumulation of water between the flexible substrate and the rigid substrate, thus making it less likely that short circuits will occur between the first lands and between the second lands.

Details of Embodiments of the Present Disclosure

Hereinafter, embodiments of the present disclosure will be described. The present disclosure is not limited to these embodiments and is defined by the scope of the appended claims, and all changes that fall within the same essential spirit as the scope of the claims are intended to be included therein.

Embodiment 1

The following describes Embodiment 1 of the present disclosure with reference to FIGS. 1 to 7. For example, as shown in FIG. 1, an electricity storage module 10 of this embodiment is used in an electricity storage pack 2 mounted in a vehicle 1. The electricity storage pack 2 is mounted in the vehicle 1 such as an electric car or hybrid car, and is used as a driving source of the vehicle 1. In the following description, only some of a plurality of members may be denoted by reference numerals while omitting reference numerals of the other members.

As shown in FIG. 1, the electricity storage pack 2 is installed at a position close to the center of the vehicle 1. A PCU (Power Control Unit) 3 is installed in the front portion of the vehicle 1. The electricity storage pack 2 and the PCU 3 are connected to each other via a wire harness 4. The electricity storage pack 2 and the wire harness 4 are connected to each other via a connector (not illustrated). The electricity storage pack 2 has an electricity storage module 10 that includes a plurality of electricity storage elements 11. The electricity storage module 10 (and an in-vehicle wiring module 20) can be mounted in any orientation, but, in the following description excluding FIG. 1, the direction indicated by arrow Z indicates an "upper side", the direction indicated by arrow X indicates a "front side", and the direction indicated by arrow Y indicates a "left side".

Figure 2:
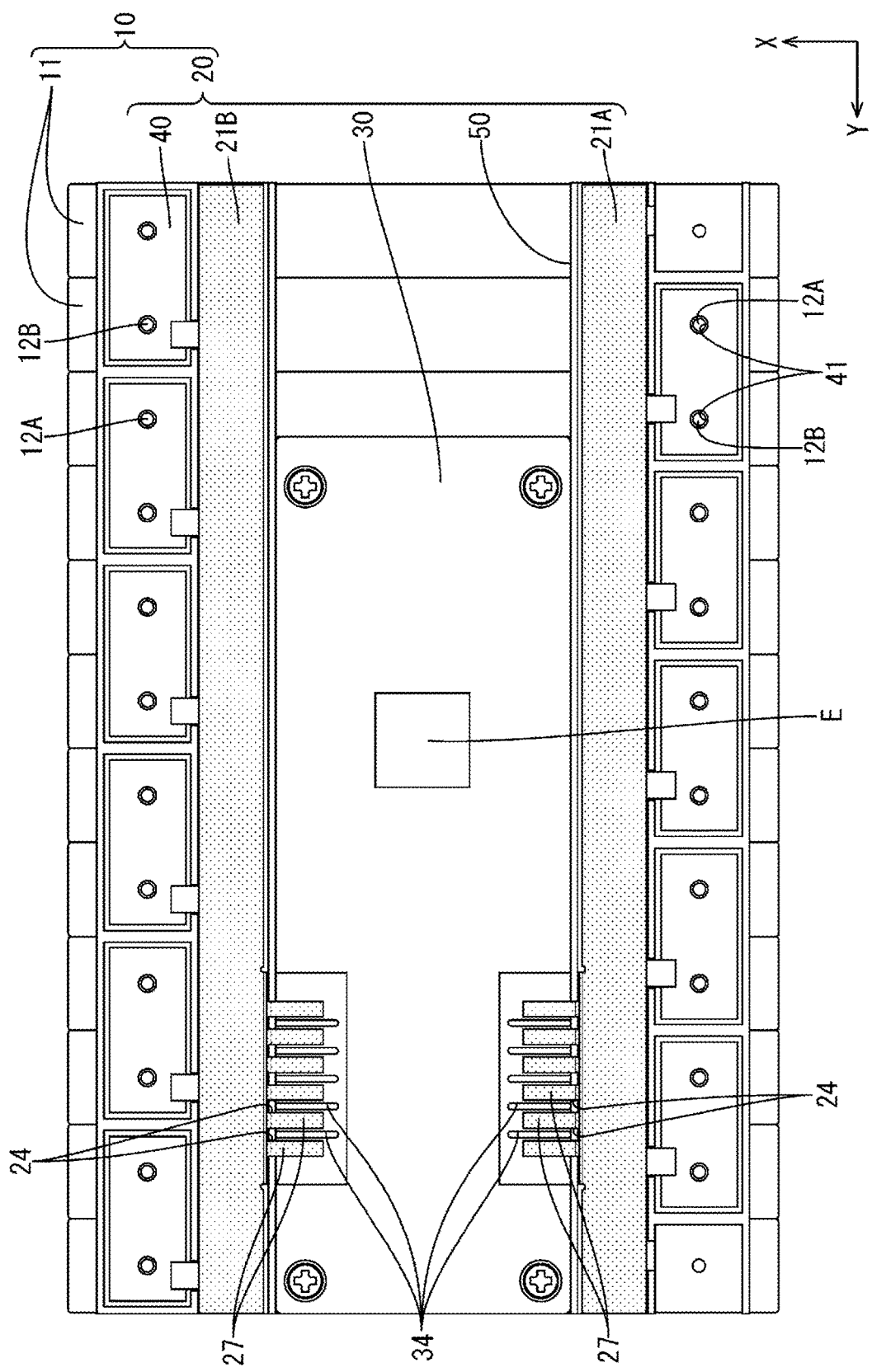
FIG. 2 is a plan view of the electricity storage module.

As shown in FIG. 2, the electricity storage module 10 includes a plurality of electricity storage elements 11 that are lined up in a row, and an in-vehicle wiring module 20 that is attached to the upper surfaces of the plurality of electricity storage elements 11. Each of the electricity storage elements 11 has a flattened rectangular parallelepiped shape, accommodates an electricity storage component (not illustrated) thereinside, and has a positive electrode terminal 12A and a negative electrode terminal 12B on its upper surface.

In-Vehicle Wiring Module

As shown in FIG. 2, the in-vehicle wiring module 20 includes two flexible substrates 21A and 21B, a rigid substrate 30 connected to the flexible substrates 21A and 21B, busbars 40 connected to electrode terminals 12A and 12B of the electricity storage elements 11, and a protector 50 that holds the flexible substrates 21A and 21B and the busbars 40. The two flexible substrates 21A and 21B have the same structure, and therefore, the following specifically describes one flexible substrate 21A and a connection structure where this flexible substrate 21A and the rigid substrate 30 are connected to each other, and a description of the other flexible substrate 21B may be omitted.

Flexible Substrate, First Conductive Path

Figure 5:
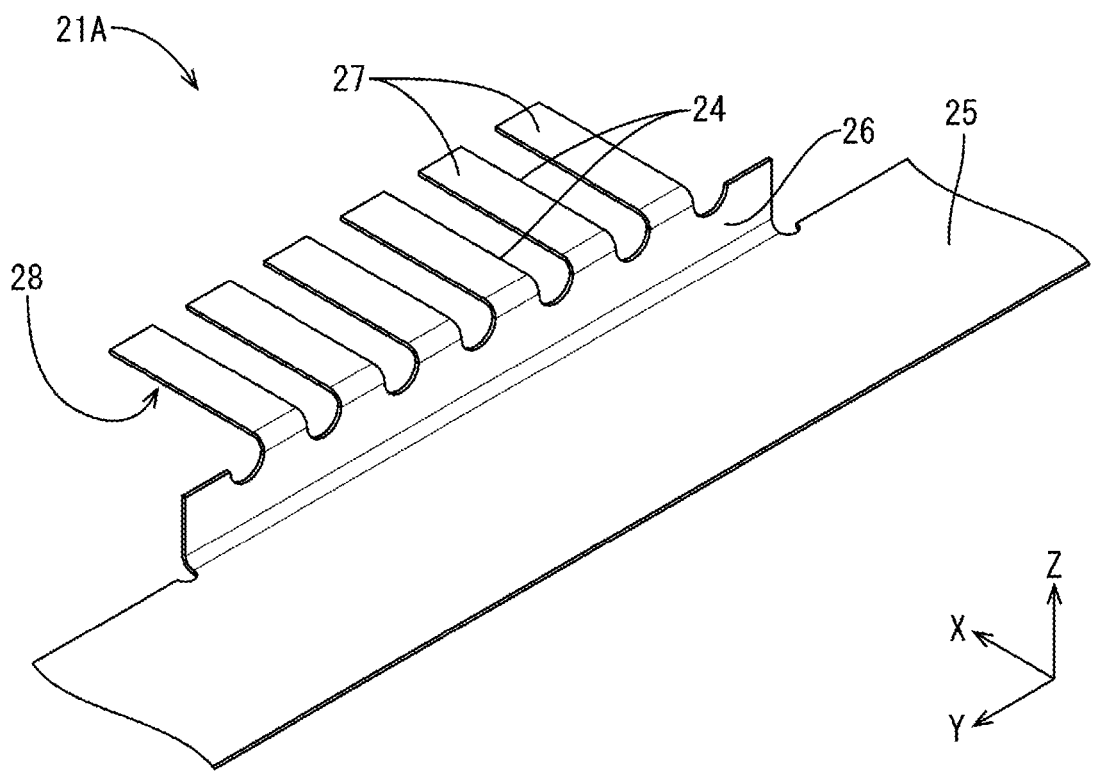
FIG. 5 is an enlarged perspective view showing first connection pieces and their surrounding region of the flexible substrate.
Figure 7:
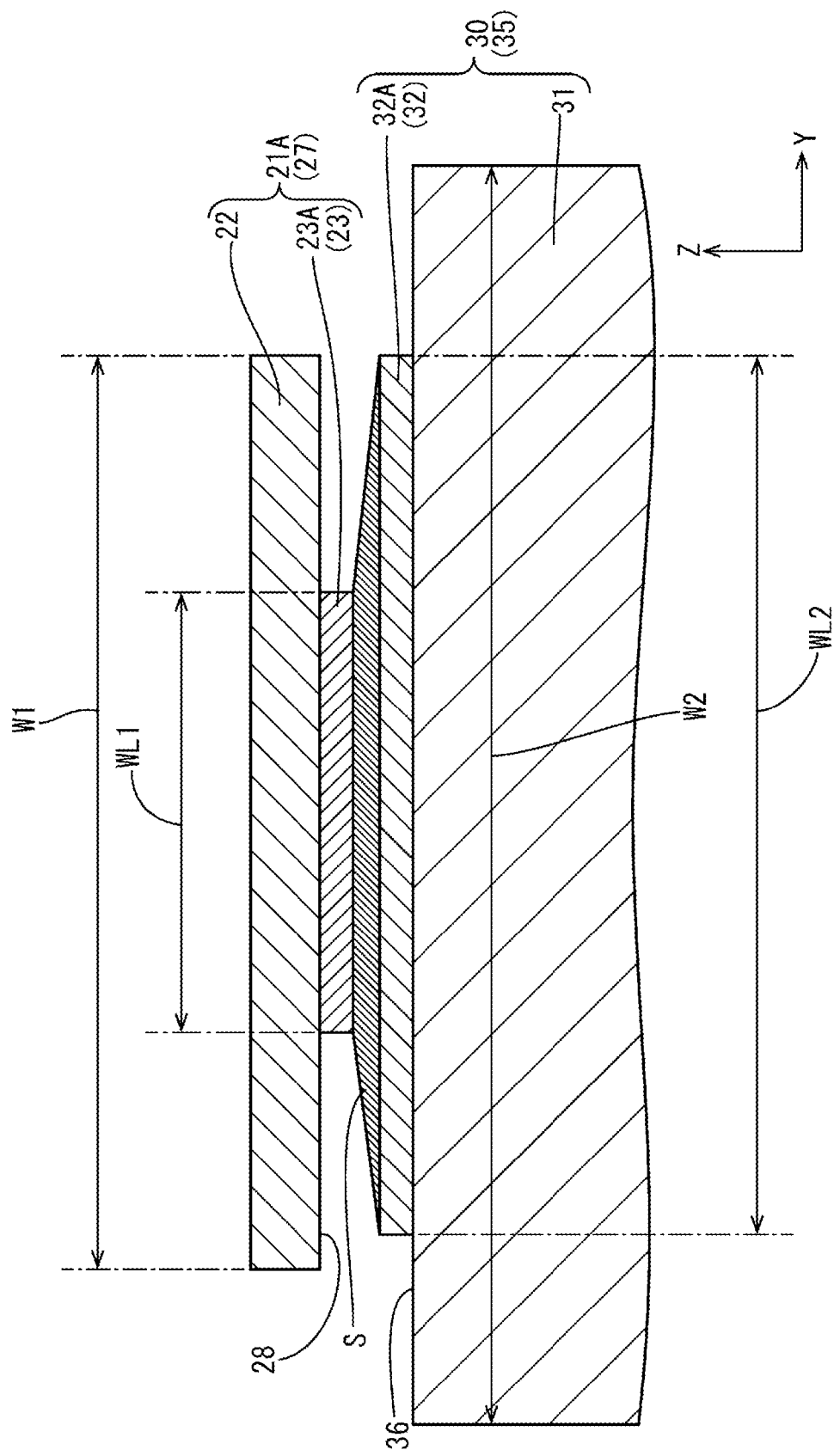
FIG. 7 is a cross-sectional view taken along line A-A in FIG. 4.

As shown in FIG. 5, the flexible substrate 21A is a substrate that is flexible and has a sheet shape. As shown in FIG. 7, the flexible substrate 21A has a base film 22 made of an insulating synthetic resin, and a first conductive path 23 routed on the base film 22. Note that the dimensions in the up-down direction of the first conductive path 23 and the like shown in FIG. 7 are exaggerated compared with the actual dimensions in order to facilitate the description. Although not illustrated, the base film 22 and the first conductive path 23 are further covered by an insulating layer constituted by an insulating overlay film, insulating coating, or the like. Examples of the materials of the base film 22 and the insulating layer include polyimide (PI) and polyethylene terephthalate (PET). The first conductive path 23 is made of, for example, a metal such as copper or a copper alloy, and has electrical conductivity. As shown in FIG. 7, in this embodiment, the first conductive path 23 is routed on one surface of the flexible substrate 21A, and the flexible substrate 21A is disposed such that the surface on which the first conductive path 23 is routed faces downward.

First Connection Piece, First Slit

As shown in FIG. 5, the flexible substrate 21A includes a main body portion 25 that has a band shape and extends in a left-right direction, a connection base portion 26 that is continuous with the main body portion 25 and stands upward, and a plurality of first connection pieces 27 that extend from the connection base portion 26 toward a side opposite to the main body portion 25 (forward). The connection base portion 26 has an elongated rectangular shape and extends along the long side of the main body portion 25. The first connection pieces 27 have a rectangular plate piece shape and are lined up in the left-right direction. The first connection pieces 27 are separated by first slits 24. The first slits 24 of the flexible substrate 21A are formed so as to be open at the front edge of the flexible substrate 21A. As shown in FIG. 2, the first connection pieces 27 of the flexible substrate 21B extend rearward from the connection piece 26. The first slits 24 of the flexible substrate 21B are formed so as to be open at the rear edge of the flexible substrate 21B.

First Opposing Surface, First Land

Figure 4:
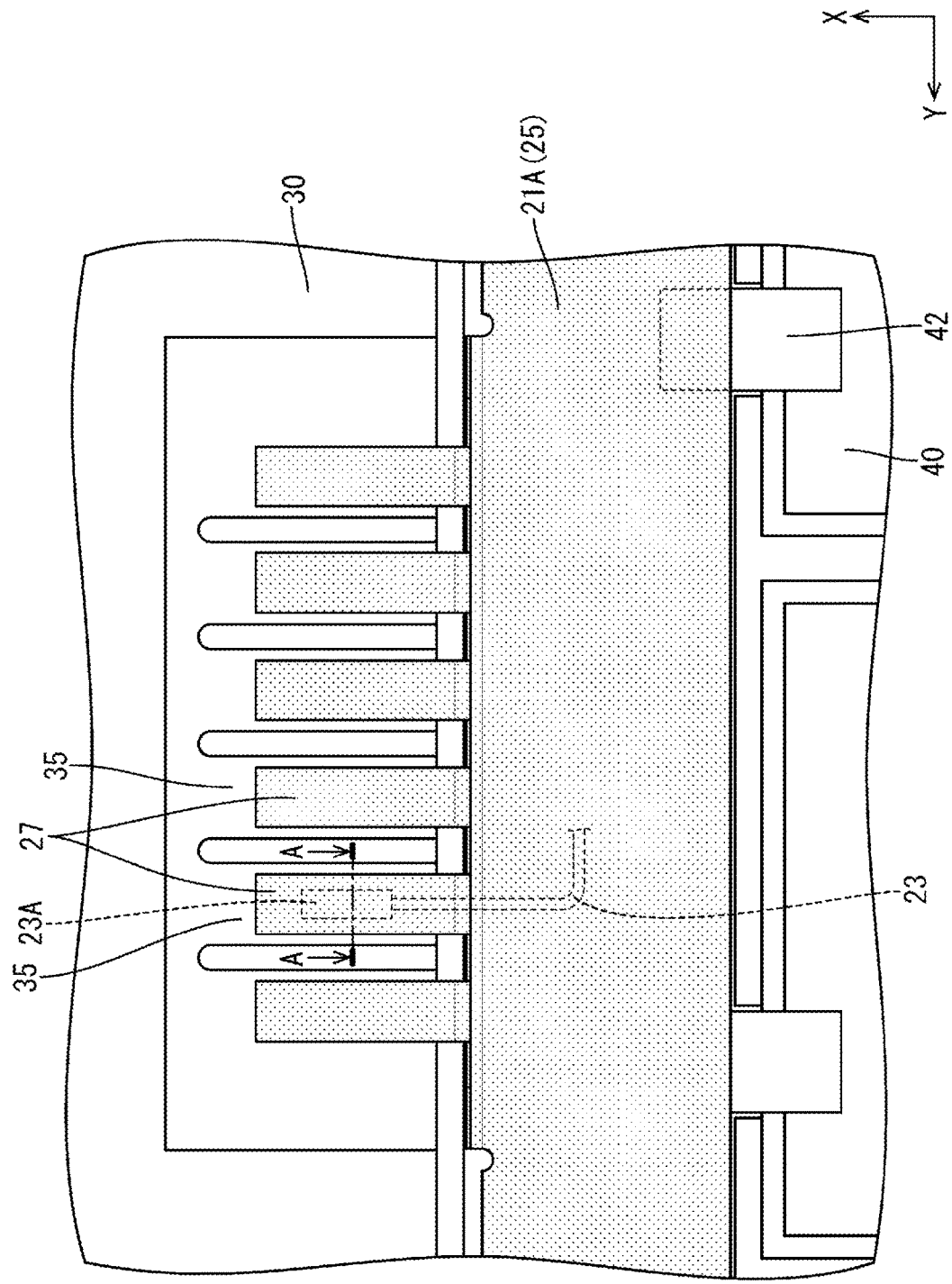
FIG. 4 is an enlarged view of FIG. 2 showing a connection portion where a flexible substrate and a rigid substrate are connected to each other and its surrounding region.

As shown in FIG. 7, the first connection pieces 27 of the flexible substrate 21A overlap the upper side of the rigid substrate 30, and the lower surfaces of the first connection pieces 27 serve as first opposing surfaces 28 that oppose the rigid substrate 30. As shown in FIGS. 4 and 7, first lands 23A arranged on the end portions of the first conductive path 23 are formed on the lower surfaces (first opposing surfaces 28) of the first connection pieces 27. One first land 23A is provided on each of the first connection pieces 27. Note that, in FIG. 4, only a part of the first conductive path 23 and a part of one first land 23A are shown. As shown in FIG. 7, the insulating layer is not formed on the lower side of the first lands 23A, and thus the first lands 23A are exposed downward. The first lands 23A are electrically connected to second lands 32A of the rigid substrate 30 via solder S.

Although not illustrated, lands for a busbar are formed on an end portion of the first conductive path 23 on a side opposite to the first lands 23A. As is the case with the first lands 23A, the lands for a busbar are also exposed downward, and are connected to the busbars 40 via relay members 42 (see FIG. 4).

Rigid Substrate, Second Conductive Path

The rigid substrate 30 is a substrate that is not flexible but rigid. As shown in FIG. 7, the rigid substrate 30 includes an insulating plate 31 that has insulation properties, and a second conductive path 32 that is routed on this insulating plate 31. The insulating plate 31 is formed by, for example, impregnating a glass fiber cloth with an epoxy resin and curing it. The second conductive path 32 is made of, for example, a metal such as copper or a copper alloy, and has electrical conductivity. The rigid substrate 30 is disposed such that a surface of the insulating plate 31 on which the second conductive path 32 is routed faces upward.

Figure 3:
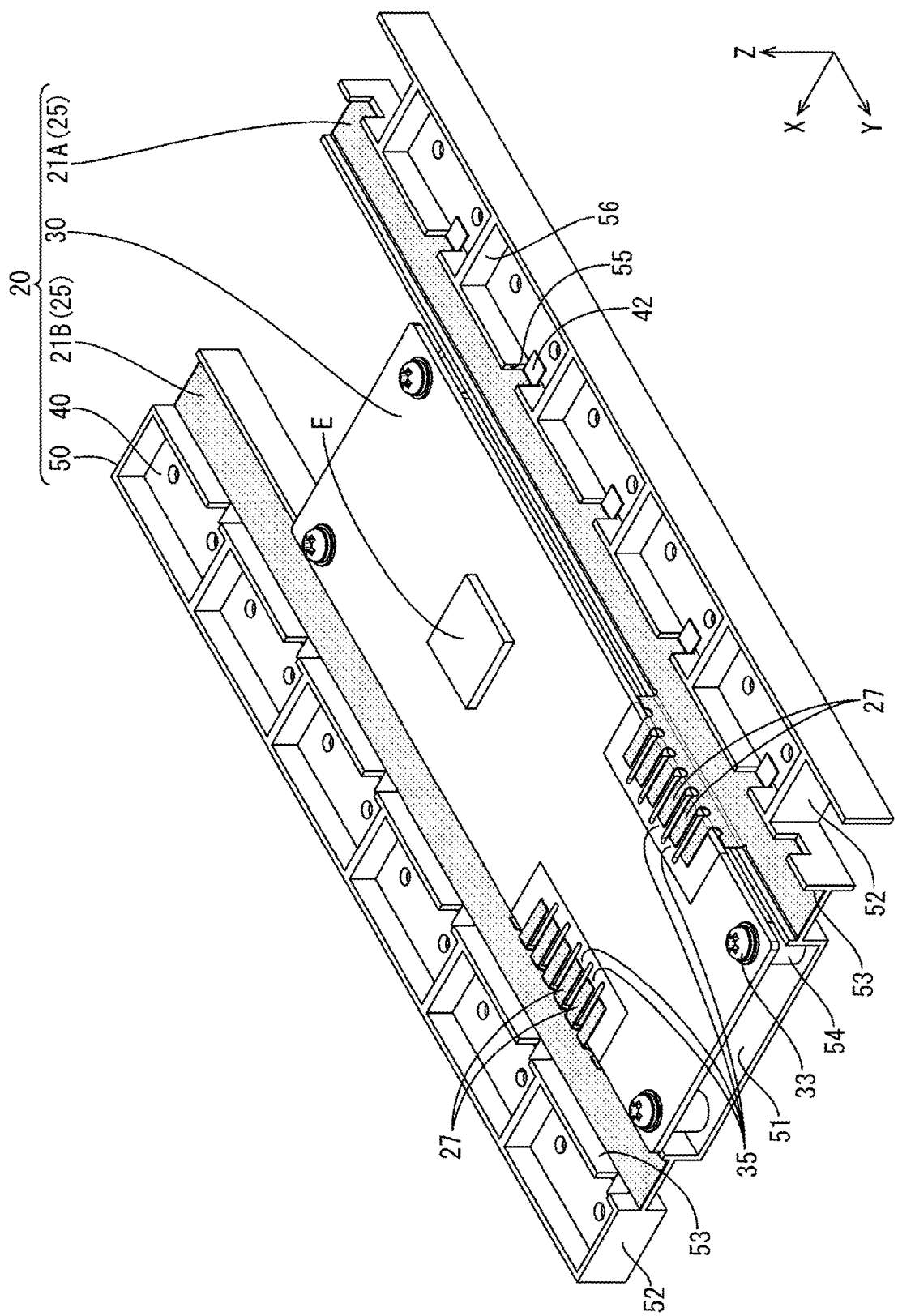
FIG. 3 is a perspective view of an in-vehicle wiring module.

As shown in FIGS. 2 and 3, the rigid substrate 30 has a rectangular shape elongated in the left-right direction. An electronic component E, connectors (not illustrated), and the like are mounted on the rigid substrate 30. Examples of the electronic component E include a microcapacitor and a switching element. Bolt-fastening holes (not illustrated) that pass through the rigid substrate 30 in the up-down direction are formed at four corners of the rigid substrate 30. As shown in FIG. 3, the rigid substrate 30 is fixed to the protector 50 by inserting bolts 33 through the bolt-fastening holes and fastening the bolts 33 to bolt-fastening portions 54 of the protector 50.

Second Slit, Second Connection Piece

Figure 6:
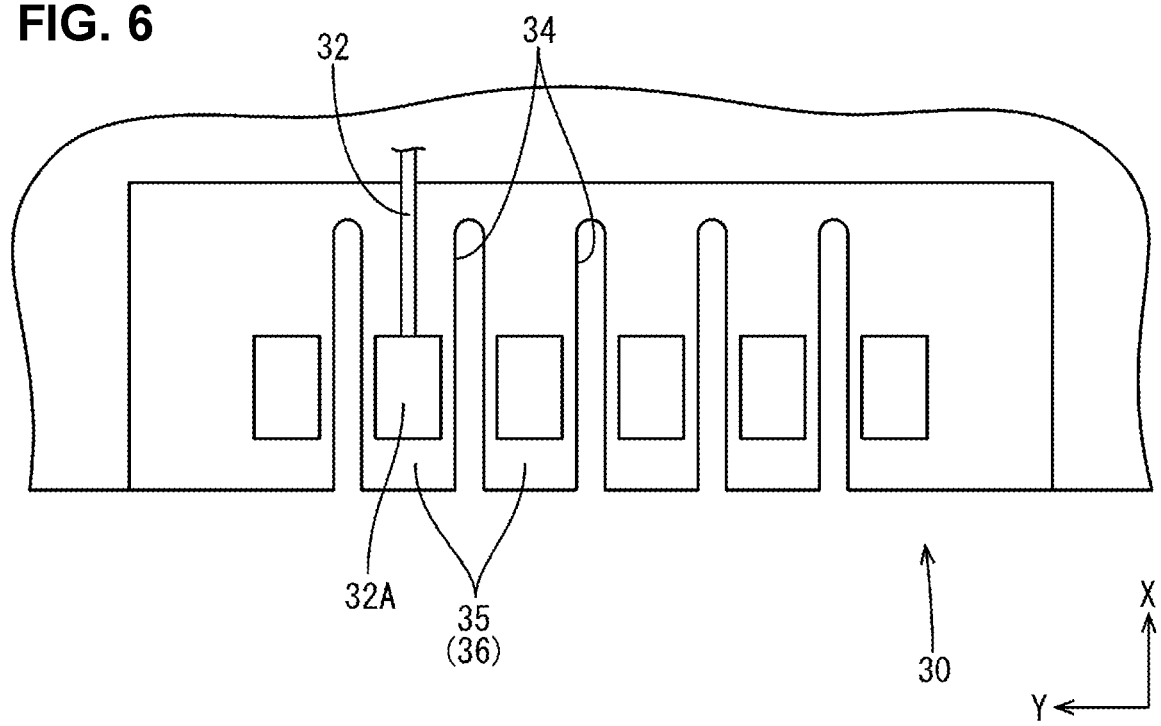
FIG. 6 is an enlarged plan view showing second connection pieces and their surrounding region of the rigid substrate.

As shown in FIG. 2, a plurality of second slits 34 are formed side-by-side in the left-right direction at the front end portion and the rear end portion of the left portion of the rigid substrate 30. The second slits 34 at the front end portion of the rigid substrate 30 are formed so as to be open at the front edge of the rigid substrate 30. The second slits 34 at the rear end portion of the rigid substrate 30 are formed so as to be open at the rear edge of the rigid substrate 30. As shown in FIG. 6, portions of the rigid substrate 30 separated by the second slits 34 serve as second connection pieces 35.

Second Opposing Surface

As shown in FIGS. 3 and 4, the second connection pieces 35 at the rear end portion of the rigid substrate 30 are arranged below the first connection pieces 27 of the flexible substrate 21A so as to overlap the corresponding first connection pieces 27, and the second connection pieces 35 at the front end portion of the rigid substrate 30 are arranged below the first connection pieces 27 of the flexible substrate 21B so as to overlap the corresponding first connection pieces 27. That is to say, as shown in FIG. 7, a portion of the upper surface of each second connection piece 35 serves as a second opposing surface 36 that opposes the lower surface (first opposing surface 28) of the corresponding first connection piece 27 of the flexible substrate 21A or 21B.

Second Land

As shown in FIGS. 6 and 7, second lands 32A arranged on the end portions of the second conductive path 32 are formed on the upper surfaces (second opposing surfaces 36) of the second connection pieces 35. One second land 32A is provided on each of the second connection pieces 35. Note that, in FIG. 6, only a part of the second conductive path 32 is shown. As shown in FIG. 7, the second lands 32A are electrically connected to the first lands 23A of the flexible substrate 21A via the solder S.

Width of First Connection Piece, Width of Second Connection Piece

As shown in FIG. 7, the width W2 (which refers to the dimension in the left-right direction) of the second connection piece 35 is set to be larger than the width W1 of the first connection piece 27, and thus the first connection piece 27 can be arranged so as to overlap an inner region in the left-right direction of the second connection piece 35. That is to say, the first connection piece 27 is arranged so as not to protrude outward in the left-right direction from the second connection piece 35. With such an arrangement, even if an external force or the like is applied to the connection portion where the first connection piece 27 and the second connection piece 35 are connected to each other, the force is less likely to be applied to only the first connection piece 27, thus making it possible to suppress deformation of the first connection piece 27, which is flexible and more likely to deform than the second connection piece 35.

Width of First Land, Width of Second Land

As shown in FIG. 7, the width WL2 of the second land 32A is set to be larger than the width WL1 of the first land 23A. The first land 23A and the second land 32A, which are electrically connected to each other, are designed such that the central positions thereof in the left-right direction coincide with each other.

It is conceivable that the disposed first land 23A and second land 32A may be misaligned due to manufacturing tolerances, temporal deformation, and the like of the flexible substrates 21A and 21B and the rigid substrate 30. In particular, the flexible substrates 21A and 21B, which are flexible, are likely to deform, thus making it likely that the width WL1 of the first lands 23A and the distance between the first lands 23A will vary due to errors. However, setting the width WL2 of the second land 32A to be larger than the width WL1 of the first land 23A makes it easy to dispose the first land 23A in a region within the width WL2 of the second land 32A and electrically connect the first land 23A to the second land 32A.

The first lands 23A are electrically connected to the second lands 32A through soldering, for example, in accordance with the following procedure.

The rigid substrate 30 in which the solder S is provided on the second lands 32A in advance is fixed to the protector 50 by fastening bolts. The flexible substrates 21A and 21B are fixed to the protector 50 using an adhesive, adhesive tape, or the like such that the first connection pieces 27 overlap the corresponding second connection pieces 35. The first lands 23A can be electrically connected to the second lands 32A via the solder S by performing instantaneous heating and cooling locally on the solder S on the second lands 32A using a pulse heating method (see FIG. 7). In addition to the pulse heating method, the first lands 23A and the second lands 32A may also be soldered through reflow processing.

Busbar

As shown in FIG. 2, the busbar 40 is a member for connecting the electrode terminals 12A and 12B of the adjacent electricity storage elements 11, and is constituted by a metal plate member having electrical conductivity. Examples of a metal used to form the busbar 40 include copper, a copper alloy, aluminum, an aluminum alloy, and stainless steel (SUS). The busbar 40 has a rectangular plate shape as a whole, and is provided with two electrode insertion holes 41 through which the electrode terminals 12A and 12B can be inserted. The busbar 40 and the electrode terminals 12A and 12B are electrically connected to each other through welding.

As shown in FIG. 4, the flexible substrate 21A is electrically connected to the busbars 40 via the relay members 42. The relay members 42 are each constituted by a metal plate member having electrical conductivity. Examples of a metal used to form the relay members 42 include nickel and a nickel alloy. As illustrated by a broken line in FIG. 4, one end portion (front end portion) of each relay member 42 is arranged below the main body portion 25 of the flexible substrate 21A, and is soldered to the land for a busbar (not illustrated) at an end portion of the first conductive path 23. The other end portion (rear end portion) of the relay member 42 is joined to the upper surface of the busbar 40 through welding.

As shown in FIG. 3, the protector 50 is made of an insulating synthetic resin and has a plate shape. The protector 50 includes a protector main body 51 located at the center thereof, busbar installation portions 52 that are provided at the front end portion and the rear end portion and on which the busbars 40 are to be installed, and wiring recessed portions 53 that are provided between the protector main body 51 and the busbar installation portions 52 and on which the flexible substrates 21A and 21B are to be installed. The bolt-fastening portions are provided at four corners of the protector main body 51, so that the rigid substrate 30 can be fixed to the protector 50.

As shown in FIG. 3, the wiring recessed portions 53 extend in the left-right direction and have a groove shape. The main body portions 25 of the flexible substrates 21A and 21B are arranged in the wiring recessed portions 53. The main body portions 25 are fixed to the wiring recessed portions 53 using an adhesive, adhesive tape, or the like. The inner walls of the wiring recessed portions 53 that are continuous with the busbar installation portions 52 are provided with cutout portions 55 in which the relay members 42 are disposed.

As shown in FIG. 3, each of the busbar installation portions 52 is formed in a frame shape without a bottom and provided with partition walls 56 for insulating the busbars 40 lined up in the left-right direction from each other. The busbar installation portion 52 includes locking hooks (not illustrated) and can thus hold the busbars 40. The busbars 40 held by the protector 50 are electrically connected to the plurality of electricity storage elements 11 (see FIG. 2). Note that a configuration may be employed in which the busbar installation portions 52 are attached to the busbars 40 connected to the plurality of electricity storage elements 11 in advance, and in this case, locking hooks or the like that can each independently hold the busbar 40 need not be provided.

Functions and Effects of Embodiment 1

Embodiment 1 exhibits the following functions and effects.

The in-vehicle wiring module 20 according to Embodiment 1 is configured to be attached to the plurality of electricity storage elements 11 having the electrode terminals 12A and 12B, the in-vehicle wiring module 20 including: the busbars 40 to be connected to the electrode terminals 12A and 12B; the flexible substrates 21A and 21B having the first conductive path 23 that is electrically connected to the busbars 40; and the rigid substrate 30 having the second conductive path 32 that is electrically connected to the first conductive paths 23, wherein the flexible substrates 21A and 21B overlap the rigid substrate 30, the flexible substrates 21A and 21B each have the first opposing surface 28 that is opposed to the rigid substrate 30, the first conductive paths 23 each have the first lands 23A that are arranged on the first opposing surface 28, the first slits 24 that are open at the edges of the flexible substrates 21A and 21B are formed between the first lands 23A of the flexible substrates 21A and 21B, the rigid substrate 30 has the second opposing surface 36 that is opposed to the flexible substrates 21A and 21B, the second conductive path 32 has the second lands 32A that are arranged on the second opposing surface 36 and are electrically connected to the first lands 23A, and the second slits 34 that are open at the edges of the rigid substrate 30 are formed between the second lands 32A of the rigid substrate 30.

With the above-mentioned configuration, the first slits 24 are formed between the first lands 23A of the flexible substrates 21A and 21B and the second slits 34 are formed between the second lands 32A of the rigid substrate 30, thus making it less likely that short circuits occur between the first lands 23A and between the second lands 32A.

In Embodiment 1, the portions of the flexible substrates 21A and 21B that are separated by the first slits 24 serve as the first connection pieces 27, one of the first lands 23A is arranged on each of the first connection pieces 27, the portions of the rigid substrate 30 that are separated by the second slits 34 serve as second connection pieces 35, one of the second lands 32A is arranged on each of the second connection pieces 35, and the width W1 of the first connection pieces 27 is different from the width W2 of the second connection pieces 35.

In Embodiment 1, the width W2 of the second connection pieces 35 is set to be larger than the width W1 of the first connection pieces 27.

With the above-mentioned configurations, the first connection pieces 27 are arranged so as not to protrude from the second connection pieces 35, thus making it less likely that the first connection pieces 27 are deformed due to an external force or the like.

In Embodiment 1, the width WL2 of the second lands 32A is set to be larger than the width WL1 of the first lands 23A.

It is conceivable that the width WL1 of the first lands 23A and the distance between the first lands 23A vary due to errors because the flexible substrates 21A and 21B are more likely to be deformed than the rigid substrate 30. However, with the above-mentioned configuration, the width WL2 of the second lands 32A is set to be larger than the width WL1 of the first lands 23A, and therefore, it is easy to electrically connect the first lands 23A and the second lands 32A even when the width WL1 of the first lands 23A and the distance between the first lands 23A vary due to errors.

In Embodiment 1, the first conductive path 23 is routed on only one surface of each of the flexible substrates 21A and 21B.

With the above-mentioned configuration, the manufacturing cost of the flexible substrates 21A and 21B can be reduced, thus making it possible to reduce the manufacturing cost of the in-vehicle wiring module 20.

Embodiment 2

Figure 8:
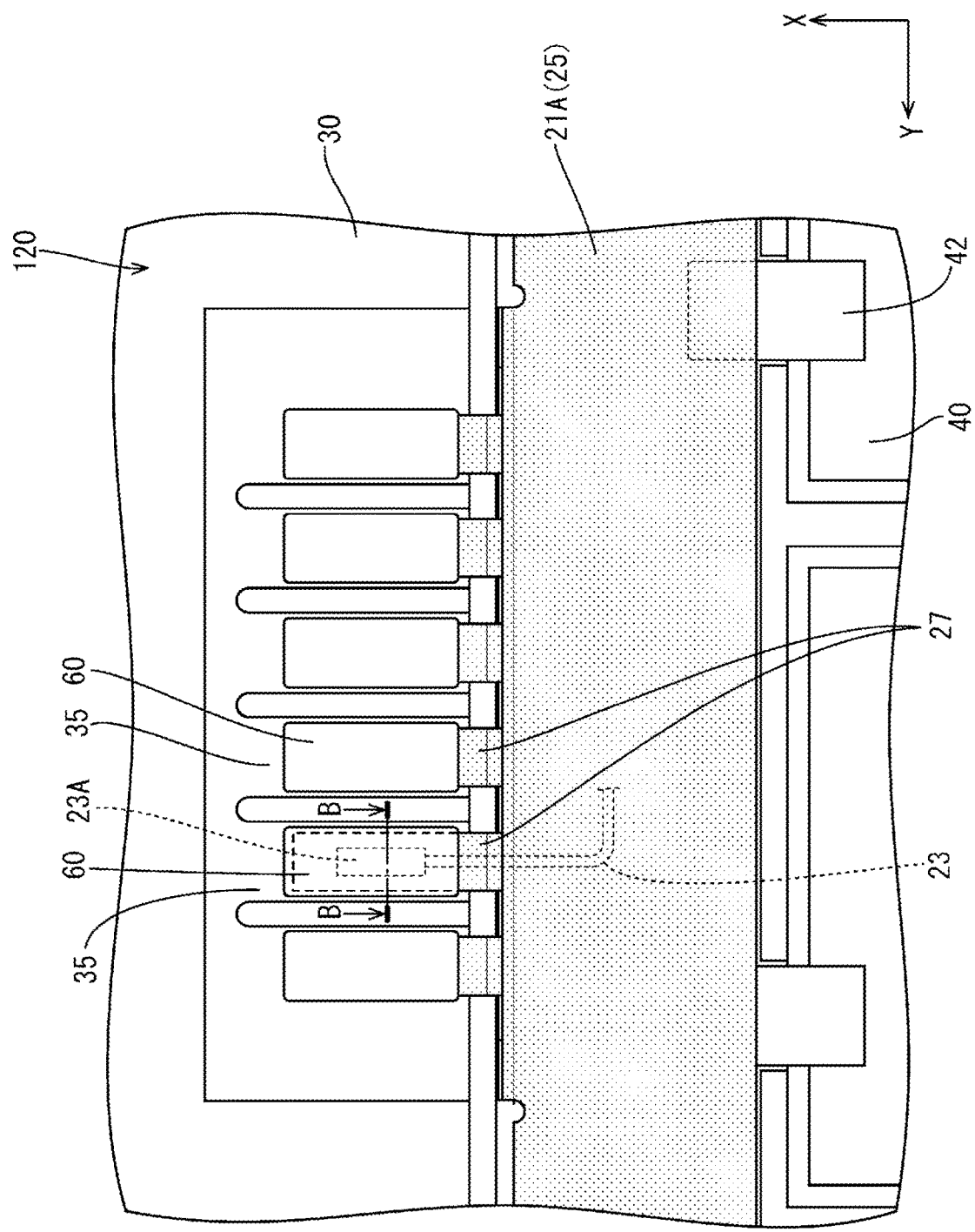
FIG. 8 is an enlarged plan view showing a connection portion where a flexible substrate and a rigid substrate are connected to each other and its surrounding region in an electricity storage module according to Embodiment 2.

The following describes Embodiment 2 of the present disclosure with reference to FIGS. 8 and 9. In the following description, members, functions, and effects that are identical to those of Embodiment 1 will not be described. In the following description, the direction indicated by arrow Z indicates an "upper side", the direction indicated by arrow X indicates a "front side", and the direction indicated by arrow Y indicates a "left side".

In-Vehicle Wiring Module

An in-vehicle wiring module 120 according to Embodiment 2 includes members that are identical to those of the in-vehicle wiring module 20 according to Embodiment 1, and further includes sealing portions 60 as shown in FIG. 8.

Sealing Portion

As shown in FIGS. 8 and 9, each of the sealing portions 60 seals the connection portion where the flexible substrate 21A and the rigid substrate 30 are connected to each other (although not illustrated, the connection portion where the flexible substrate 21B and the rigid substrate 30 are connected to each other also has the same configuration). The sealing portions 60 are formed using a resin material made of an insulating synthetic resin that has fluidity before solidified and loses the fluidity when solidified. An example of such a material is a potting material.

As shown in FIG. 9, the sealing portion 60 is formed on the upper surface of the second connection piece 35 and covers the first connection piece 27. More specifically, the sealing portion 60 has a dome-like external shape and covers the entire peripheries of the base film 22, the first land 23A, the second land 32A, and the connection portion (solder S) where the first land 23A and the second land 32A are connected to each other. This makes it possible to suppress accumulation of water in the gap of the connection portion where the flexible substrate 21A and the rigid substrate 30 are connected to each other, which is caused by the capillary phenomenon. The first connection pieces 27, which are flexible, are buried in the sealing portion 60, and is thus less likely to be deformed. Note that, in this embodiment, a separate sealing portion 60 is provided for each first connection piece 27 as shown in FIG. 8, but a configuration may also be employed in which a sealing portion 60 that collectively covers the plurality of first connection pieces 27 is formed.

Functions and Effects of Embodiment 2

Embodiment 2 exhibits the following functions and effects.

In Embodiment 2, the connection portion where the first land 23A and the second land 32A are connected to each other is sealed by a sealing portion 60 constituted by an insulating resin.

With the above-mentioned configuration, it is possible to suppress accumulation of water between the flexible substrates 21A and 21B and the rigid substrate 30, thus making it less likely that short circuits occur between the first lands 23A and between the second lands 32A.

Embodiment 3

The following describes Embodiment 3 of the present disclosure with reference to FIG. 10. In the following description, members, functions, and effects that are identical to those of Embodiment 1 will not be described. In the following description, the front side of the sheet of FIG. 10 corresponds to an "upper side", the direction indicated by arrow X indicates a "front side", and the direction indicated by arrow Y indicates a "left side".

In-Vehicle Wiring Module

As shown in FIG. 10, an electricity storage module 210 of this embodiment includes a plurality of electricity storage elements 11 that are lined up in a row, and an in-vehicle wiring module 220 that is attached to the upper surfaces of the plurality of electricity storage elements 11. The in-vehicle wiring module 220 includes two flexible substrates 221A and 221B, a rigid substrate 230 connected to the flexible substrates 221A and 221B, and busbars 40 connected to electrode terminals 12A and 12B of the electricity storage elements 11. The in-vehicle wiring module 220 has a configuration different from that of the in-vehicle wiring module 20 according to Embodiment 1 in that the protector is not provided.

The flexible substrates 221A and 221B and the rigid substrate 230 are attached directly to the upper surfaces of the plurality of electricity storage elements 11 via an adhesive, adhesive tape, or the like. Accordingly, the height of the in-vehicle wiring module 220 can be reduced by the height of the protector compared with the in-vehicle wiring module 20 of Embodiment 1.

Other Embodiments (1) Although the embodiments above have a configuration in which the busbars 40 are electrically connected to the flexible substrates 21A and 21B or 221A and 221B via the relay members 42, the present invention is not limited to this configuration, and a configuration may also be employed in which the busbars are directly connected to the flexible substrates.

(2) Although the first lands 23A are electrically connected to the second lands 32A via the solder S in the embodiments above, the present invention is not limited to this configuration, and a configuration may also be employed in which the first lands are electrically connected to the second lands via, for example, anisotropic conductive films (ACFs).

(3) Although the embodiments above have a configuration in which the first conductive path 23 is routed on one surface of each of the flexible substrates 21A and 21B or 221A and 221B, the present invention is not limited to this configuration, and a configuration may also be employed in which the first conductive paths are routed on both surfaces of each flexible substrate.

(4) Although the embodiments above have a configuration in which two flexible substrates 21A and 21B or 221A and 221B are provided, the present invention is not limited to this configuration, and a configuration may also be employed in which a single flexible substrate or three or more flexible substrates are provided.

(5) Although the embodiments above have a configuration in which one rigid substrate 30 or 230 is provided, the present invention is not limited to this configuration, and a configuration may also be employed in which two or more rigid substrates are provided.

(6) Although the embodiments above have a configuration in which the width W2 of the second connection pieces 35 is set to be larger than the width W1 of the first connection pieces 27, a configuration may also be employed in which the width of the second connection pieces is set to be equal to the width of the first connection pieces or smaller than the width of the first connection pieces.

(7) Although the embodiments above have a configuration in which the width WL2 of the second lands 32A is set to be larger than the width WL1 of the first lands 23A, a configuration may also be employed in which the width of the second lands is set to be equal to the width of the first lands or smaller than the width of the first lands.

LIST OF REFERENCE NUMERALS

1: Vehicle
2: Electricity storage pack
3: PCU
4: Wire harness
10, 210: Electricity storage module
11: Electricity storage element
12A, 12B: Electrode terminal
20, 120, 220: In-vehicle wiring module
21A, 21B, 221A, 221B: Flexible Substrate
22: Base film
23: First conductive path
23A: First land
24: First slit
25: Main body portion
26: Connection base portion
27: First connection piece
28: First opposing surface
30, 230: Rigid substrate
31: Insulating plate
32: Second conductive path
32A: Second land
33: Bolt
34: Second slit
35: Second connection piece
36: Second opposing surface
40: Busbar
41: Electrode insertion hole
42: Relay member
50: Protector
51: Protector main body
52: Busbar installation portion
53: Wiring recessed portion
54: Bolt-fastening portion
55: Cutout portion
56: Partition wall
60: Sealing portion
E: Electronic component
S: Solder
W1: Width of first connection piece
W2: Width of second connection piece
WL1: Width of first land
WL2: Width of second land

The invention claimed is:

1. An in-vehicle wiring module configured to be attached to a plurality of electricity storage elements having electrode terminals, the in-vehicle wiring module comprising:
busbars to be connected to the electrode terminals;
a flexible substrate having a first conductive path that is electrically connected to the busbars; and
a rigid substrate having a second conductive path that is electrically connected to the first conductive path,
wherein the flexible substrate overlaps the rigid substrate,
the flexible substrate has a first opposing surface that is opposed to the rigid substrate,
the first conductive path has first lands that are arranged on the first opposing surface,
first slits that are open at an edge of the flexible substrate are formed between the first lands of the flexible substrate,
the rigid substrate has a second opposing surface that is opposed to the flexible substrate,
the second conductive path has second lands that are arranged on the second opposing surface and are electrically connected to the first lands,
second slits that are open at an edge of the rigid substrate are formed between the second lands of the rigid substrate, and
the flexible substrate further comprises:
a main body portion including the first opposing surface that is a planar upper surface opposed to and extending in parallel with a lower surface of the rigid substrate;
a vertical base portion that extends perpendicular from an end of the main body portion; and
a horizontal connecting portion including the first slits, wherein the horizontal connecting portion extends perpendicular from an upper end of the vertical base portion and has a planar surface that contacts an upper surface of the rigid substrate.

2. The in-vehicle wiring module according to claim 1, wherein portions of the flexible substrate that are separated by the first slits serve as first connection pieces,
one of the first lands is arranged on each of the first connection pieces,
portions of the rigid substrate that are separated by the second slits serve as second connection pieces,
one of the second lands is arranged on each of the second connection pieces, and
a width of the first connection pieces is different from a width of the second connection pieces.

3. The in-vehicle wiring module according to claim 2, wherein the width of the second connection pieces is larger than the width of the first connection pieces.

4. The in-vehicle wiring module according to claim 3, wherein a width of the second lands is larger than a width of the first lands.

5. The in-vehicle wiring module according to claim 1, wherein the first conductive path is routed on only one surface of the flexible substrate.

6. The in-vehicle wiring module according to claim 3, wherein a connection portion where the first land and the second land are connected to each other is sealed by a sealing portion constituted by an insulating resin.

* * * * *